(12) United States Patent
Light

(10) Patent No.: US 6,808,958 B2
(45) Date of Patent: Oct. 26, 2004

(54) METHODS OF BONDING MICROELECTRONIC ELEMENTS

(75) Inventor: David Light, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 209 days.

(21) Appl. No.: 10/093,213

(22) Filed: Mar. 7, 2002

(65) Prior Publication Data

US 2002/0142516 A1 Oct. 3, 2002

Related U.S. Application Data

(60) Provisional application No. 60/273,993, filed on Mar. 7, 2001.

(51) Int. Cl.[7] ............................................. H01L 21/44
(52) U.S. Cl. ........................ 438/106; 438/119; 438/612
(58) Field of Search ................................ 438/106, 107, 438/108, 118, 119, 612, 613, 614, 615, 616

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,489,749 A | 2/1996 | DiStefano et al. |
| 5,518,964 A | 5/1996 | DiStefano et al. |
| 5,536,909 A | 7/1996 | DiStefano et al. |
| 5,679,194 A | 10/1997 | Fjelstad et al. |
| 5,679,977 A | 10/1997 | Khandros et al. |
| 5,807,453 A | 9/1998 | Smith et al. |
| 5,844,320 A | 12/1998 | Ono et al. |
| 5,859,472 A | 1/1999 | DiStefano et al. |
| 5,904,498 A | 5/1999 | Fjelstad |
| 5,977,618 A | 11/1999 | DiStefano et al. |
| 5,989,936 A | 11/1999 | Smith et al. |
| 6,046,910 A * | 4/2000 | Ghaem et al. ............... 361/760 |
| 6,083,837 A | 7/2000 | Millet |
| 6,103,551 A | 8/2000 | Ono et al. |
| 6,117,694 A | 9/2000 | Smith et al. |
| 6,217,972 B1 | 4/2001 | Beroz et al. |
| 6,228,685 B1 | 5/2001 | Beroz et al. |
| 6,519,842 B2 * | 2/2003 | Fukunaga et al. ............ 29/840 |

OTHER PUBLICATIONS

Ono, M.; Shiraishi, T.; Bessho, Y.; Eda, K.; Ishida, T., Area–Array Interconnection Using Stud–Bump–Bonding, about 1998, pp. 893–898.

* cited by examiner

Primary Examiner—Tuan H. Nguyen
(74) Attorney, Agent, or Firm—Lerner, David, Littenberg, Krumholz & Mentlik, LLP

(57) ABSTRACT

A method of electrically interconnecting microelectronic elements comprises providing a first microelectronic element having contacts with protrusions and dipping the protrusions into a layer of bonding material. At least some of the bonding material is transferred onto the contacts. The contacts are bonded to conductive features of a second microelectronic element.

37 Claims, 8 Drawing Sheets

METHODS OF BONDING MICROELECTRONIC ELEMENTS

CROSS-REFERENCE TO RELATED APPLICATIONS

This application claims benefit of U.S. Provisional Patent Application 60/273,993, filed Mar. 7, 2001, the disclosure of which is hereby incorporated by reference herein.

FIELD OF THE INVENTION

The present invention relates to a method of assembling microelectronic elements with other microelectronic elements, and to forming microelectronic packages.

BACKGROUND OF THE INVENTION

Certain microelectronic elements comprise contacts exposed on a surface of the microelectronic element, such as a semiconductor chip with contacts. The contacts are used to electrically interconnect the chip with external circuits. Typically, certain microelectronic elements such as semiconductor chips are assembled into microelectronic packages. Certain methods of forming microelectronic packages involve electrically interconnecting a first microelectronic element with a component or other element and connecting contacts on the microelectronic element to conductive features on the component or other element.

Certain methods of forming microelectronic packages comprise assembling a wafer incorporating a plurality of semiconductor chips with a component having conductive features. It is known to form gold studs on conductive pads on the wafer and to apply a solder material to the studs by plating the solder material onto the studs. Plating typically requires forming a mask so that the solder is applied to the ends of the studs while other surfaces are projected. The wafer is subjected to the plating process and is typically protected by the mask during plating.

After applying solder material, the conductive features on the component and the studs on the wafer are joined by heating the solder material to the reflow temperature of the solder and allowing the solder to cool. In the alternative, the conductive features may be joined to the studs using methods such as thermosonic and thermocompression bonding, which do not require a distinct bonding material. These methods require equipment designed for thermosonic or thermocompression bonding.

Methods for electrically connecting contacts of a first microelectronic element to the conductive features of a second microelectronic element are disclosed in certain embodiments of U.S. Pat. No. 5,518,964, the disclosure of which is hereby incorporated by reference herein. In certain embodiments of U.S. Pat. No. 5,518,964, a wafer, incorporating a number of semiconductor chips, is assembled with a component having individual chip regions. Contacts of the chips are bonded to leads of the component so that each chip is connected to a chip region of the component. In certain embodiments, a resist layer is applied to the leads and photolithographically patterned to form openings in the resist layer at the desired locations for spots of bonding material. The electrically conductive bonding material is electroplated onto the leads in each opening in the resist layer. The leads are bonded to the contacts of the semiconductor chips using the spots of bonding material.

It is also known to stencil solder material onto the studs. The stencil has a first surface, a second surface and apertures. The first surface is juxtaposed with the first face of the microelectronic element. The stencil must be positioned so that the apertures are aligned with the studs on the microelectronic element. The solder material is deposited on the second surface of the stencil and drawn across the second surface, typically using a squeegee, so that solder enters the apertures and contacts the studs. Proper alignment of the stencil apertures with the studs is required so that solder material is deposited on the studs with at least some accuracy.

Despite the availability of techniques for assembling microelectronic packages, further improvements are desired.

SUMMARY OF THE INVENTION

In one aspect of the present invention, a method of electrically interconnecting microelectronic elements comprises providing a first microelectronic element having a first surface and contacts exposed at the first surface. The contacts include protrusions extending away from the first surface. The method includes providing a substantially uniform layer of bonding material on a support, dipping the protrusions of the contacts into the substantially uniform layer of bonding material so as to transfer the bonding material onto the contacts, and bonding the contacts to conductive features of a second microelectronic element. Preferably, the protrusions are dipped so that a substantially uniform amount of bonding material is transferred onto the contacts. The step of dipping does not require the precise alignment required for stenciling. Plating is not required to deposit bonding material onto the contacts.

The first microelectronic element and the second microelectronic element may be juxtaposed with one another so that the bonding material is contiguous with the contacts and conductive features. The bonding material may be heated before the step of juxtaposing the first and second microelectronic elements. The bonding material may also be heated while the first and second microelectronic elements are juxtaposed with one another.

In certain embodiments, the step of bonding includes applying heat to the bonding material. However, the bonding material may be heated either before or during the step of bonding the contacts to the conductive features of the second microelectronic element. In a preferred embodiment, the bonding material comprises solder paste and the step of heating comprises heating the solder paste to reflow the solder paste. The step of heating may comprise heating the contacts of the first microelectronic element before the step of dipping so that the solder paste transferred to the contacts is heated. In certain embodiments, the protrusions are heated to reflow the solder paste while the protrusions and conductive features are contiguous with the solder paste. In certain preferred embodiments, the contacts are heated before or after the step of dipping. The contacts may comprise pads exposed at the first surface of the first microelectronic element. The protrusions of the contacts may comprise studs attached to the pads. The studs may comprise gold studs, or protrusions of any other material or shape.

The studs may have a first end connected to the pads and a second end facing away from the pads for receiving the bonding material. The bonding material is preferably applied to the second end of the studs by dipping the second end of the studs in the bonding material. The method may include forming the studs utilizing wire bonding.

In certain preferred embodiments, the first microelectronic element comprises a semiconductor wafer having a plurality of semiconductor chips, each semiconductor chip having contacts to be bonded to conductive elements of the second microelectronic element.

The wafer may include a plurality of elongated leads extending along the first surface. Each lead is connected to a contact. The leads may have a first end connected to a contact and a second end carrying a protrusion.

In certain preferred embodiments, the leads are deformed after the step of bonding. The second ends are displaced relative to the first ends of the leads so as to bend the second ends away from the first surface. The assembly may be encapsulated by injecting a curable flowable dielectric material around the leads and curing the dielectric material. In certain preferred embodiments, the dielectric layer comprises a flexible dielectric layer. The step of displacing the second ends of the leads may comprise moving the wafer and flexible dielectric layer with respect to one another. The wafer and the dielectric layer may be severed so as to form a plurality of units.

In certain embodiments, the conductive features comprise elongated leads extending along a first face of the second semiconductor element. At least some of the leads are bonded to a contact during the bonding step. The leads may have first ends and second ends and the second ends may be displaced with respect to the first ends so as to bend the second ends away from the first face. A flowable dielectric material may be injected around the leads to form a dielectric support layer around the leads.

The first and second microelectronic element may comprise any microelectronic element, including semiconductor chips, wafers, support layers, and other microelectronic elements. The contacts and protrusions may be provided on the first microelectronic element, the second microelectronic element, or both. In certain embodiments, the dielectric layer has leads that are attached to contacts on the dielectric layer at the first ends and that carry protrusions at the second ends. The wafer may have contacts with protrusions and the dielectric layer may have leads that are bonded to the protrusions on the wafer.

BRIEF DESCRIPTION OF THE DRAWINGS

These and other features, aspects, and advantages of the present invention will become better understood with regarding to the following description, appended claims, and accompanying drawings where:

DETAILED DESCRIPTION

Figure 1:
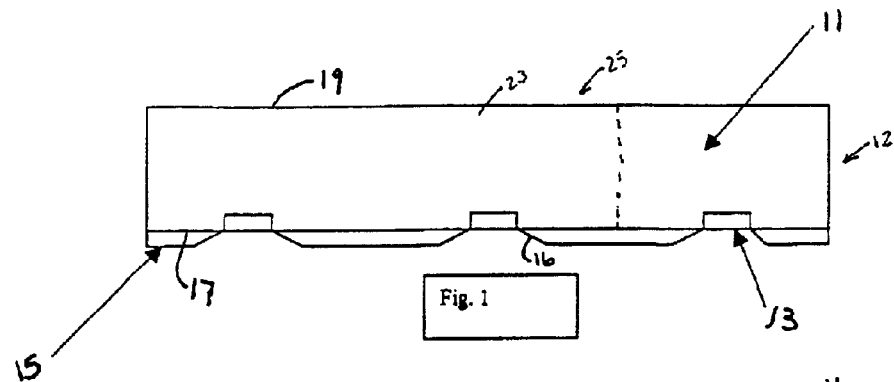
FIG. 1 is a schematic, cross-sectional view of a first microelectronic element which may be used in a method in accordance with an embodiment of the invention.

A preferred embodiment of the invention is shown in FIGS. 1–7. As shown in FIG. 1, a first microelectronic element 12 is provided. In certain preferred embodiments, the first microelectronic element 12 comprises a semiconductor wafer 11. The semiconductor wafer 11 includes a plurality of individual semiconductor chips 23 in individual chip regions 25 of the wafer. Each chip region 25 includes the elements of a complete semiconductor chip.

The wafer 11 has a first surface 17 and a second surface 19 facing in a direction opposite from the first surface 17. Each semiconductor chip 23 of wafer 11 has conductive elements 27 for forming connections with another microelectronic element. The conductive elements 27 may comprise contacts 13 exposed at the first surface 17. The contacts 13 comprise conductive material exposed at the first surface. Various conductive materials may be used, such as aluminum or copper. Preferably, the contacts comprise a non-solder-wettable material. The figures schematically show only three contacts on wafer 11 and only two chip regions 25 for ease of illustration. Many more contacts for each of many semiconductor chips would be included in a typical wafer. The contacts may have a number of shapes in plan, including circular, rectangular or the shape of any polygon. The figures are not drawn to scale and are schematic depictions of the elements shown.

The wafer 11 preferably has a passivation layer 15, which may comprise conventional silicon oxide, silicon nitride or other inorganic compounds, as known in the art. Additionally or alternatively, the passivation layer may include a polymeric material such as polyimide. The passivation layer 15 has apertures 16 permitting access to the contacts 13 and preferably is not wettable by solder or other bonding materials. Alternatively, the first surface 17 may be covered by a solder mask having apertures aligned with the contacts 13.

Figure 2:
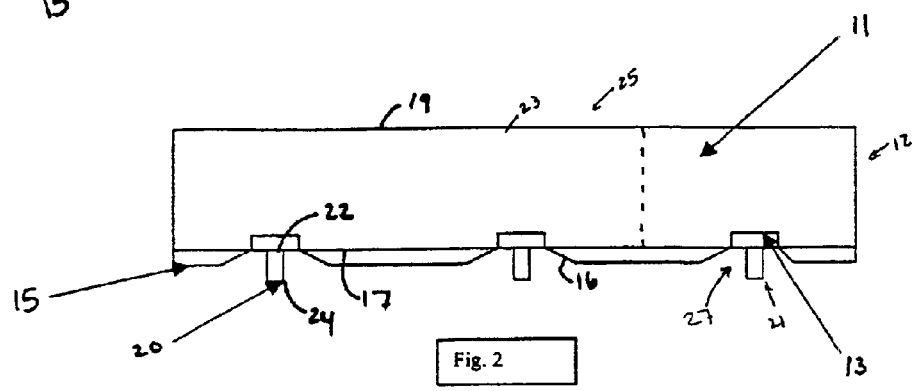
FIG. 2 is the cross-sectional view of FIG. 1 at a later stage in the method of the embodiment of FIG. 1.

The contacts 13 preferably include protrusions 21, such as studs 20, or protrusions of other types that protrude outwardly away from the first surface. The studs 20 are formed on the contacts 13 of wafer 11, as shown in FIG. 2. The studs 20 have a first end 22 connected to the contacts 13 and a second end 24 opposite the first end 22. The studs extend outwardly and away from the first surface of the wafer so that the second end 24 faces away from the first end 22 and first surface 17. In certain embodiments, the studs 20 comprise gold studs. The studs may also comprise any other solder-wettable material and any material that can be used with a solder to form an electrical connection.

The studs 20 may be formed by attaching short sections of wire to the contacts 13 in a process known as wire bonding. Gold or other solderable material is fed through a bonding tool typically having a wire feed hole. A continuous wire of the solderable material is introduced into the hole and the tool is engaged with the contact 13. While the tool holds the wire firmly against the pad, energy is applied to bond the wire to the pad. Bonding is accomplished using either thermocompression, ultrasonic or thermosonic bonding. Heat energy is used to bond the wire to the pad in thermocompression bonding and ultrasonic energy is used in ultrasonic bonding. Thermosonic bonding involves both heat and ultrasonic energies. The tool is withdrawn to feed the wire through the hole. The wire is severed, typically by melting or "flaming off".

Figure 2A:
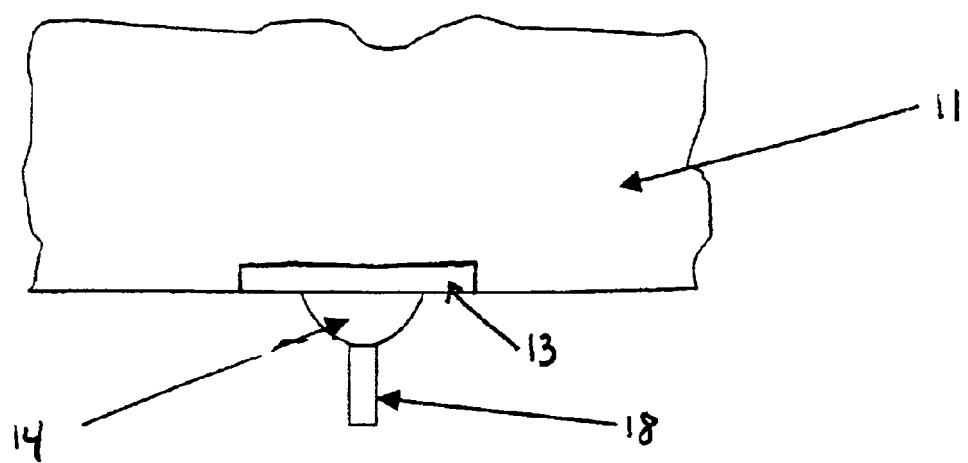
FIG. 2A is a partial cross-sectional view showing a contact in the method of the embodiment of FIGS. 1 and 2.

The studs 20 need not be formed in a perfectly straight columnar configuration and the shape of the studs in the figures are depicted as columns for ease of illustration. Preferably, the wire bonding is performed so that the stud is substantially vertical with respect to the first surface 17. The spacing and height of the studs on the wafer 11 is preferably substantially consistent so that the studs can be more easily aligned with features of another microelectronic element. During wire bonding, a ball 14 of solderable material is attached to the contact 13 and a wire 18 extends from the ball, as shown in FIG. 2A. Other methods may be used to form the studs or contacts having other shapes. For example, a resist may be deposited on the first surface 17 of the wafer 11. The resist may be patterned to form openings in the resist that are aligned with areas on the contacts 13. Metal may be plated onto the contacts, in the openings formed in the patterned resist. The studs 20, for example, may have a total height of about 1–6 mils and a width that occupies about ⅓ to ½ of the surface of the contacts 13.

The second microelectronic element may comprise any microelectronic element. In certain preferred embodiments, the second microelectronic element comprises a dielectric layer 50. The dielectric layer preferably comprises a flexible dielectric layer, such as a layer of polyimide.

Figure 6:
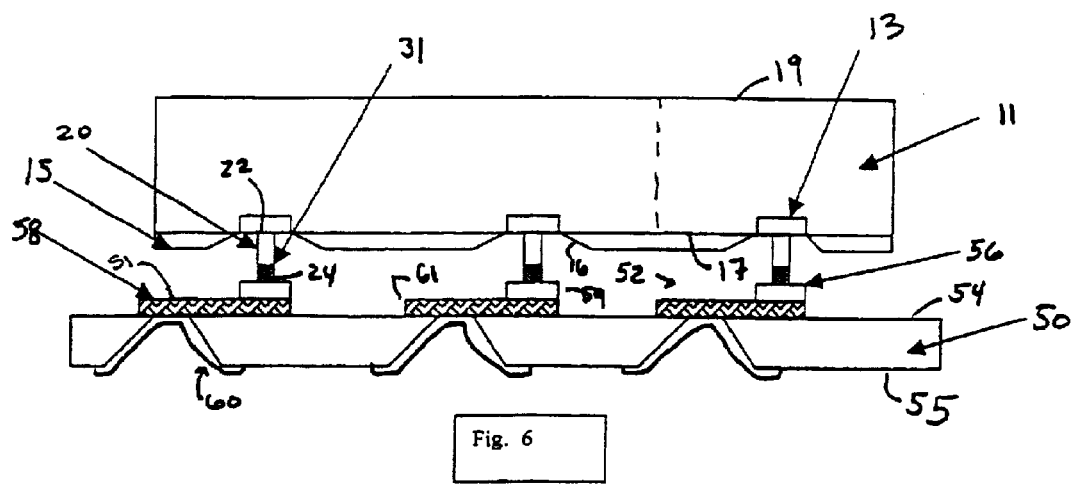
FIG. 6 is a schematic, cross-sectional view of a first microelectronic element and second microelectronic element at a later stage in the method of the embodiment of FIGS. 1–5.

As depicted in FIG. 6, the dielectric layer 50 has a first face 54 and a second face 55. The dielectric layer includes conductive features 52 for bonding with the contacts 13 of the first microelectronic element 12. In certain preferred embodiments, the conductive features 52 comprise leads 51 disposed on the first face 54 of the dielectric layer 50. Each lead 51 has a terminal end 61 firmly attached to the dielectric layer, an elongated portion 58 extending on first face 54 of the layer, and a tip end 59 opposite from the terminal end 61. The tip end 59 is releasably attached to the dielectric,layer 50. The leads may be constructed and formed as disclosed in certain embodiments of commonly assigned U.S. Pat. Nos. 5,536,909, 5,489,749, 5,763,941, 5,518,964, 6,117,694, 5,977,618, 5,787,581, 5,904,498, 5,807,453, 5,859,472 and 5,679,194, the disclosures of which are hereby incorporated by reference herein. The dielectric layer 50 preferably includes terminal structures 60 exposed at the second face 55 of the layer. The terminal structures 60 may incorporate vias extending through the dielectric layer and lined with electrically conductive material, such as the terminal structures 60 shown in FIG. 6.

The dielectric layer 50 with conductive features may be made in a number of methods. Metal may be added or removed from the metal layer, in a pattern of conductive features, using photolithographic methods well known in the art. Terminals may be formed by ablating the layer to form vias and the vias may be lined with conductive material, such as by seeding and electroplating metal in the vias. The conductive features and terminals may be formed as disclosed in certain embodiments of U.S. Pat. Nos. 5,518,964; 6,083,837; 5,989,936; 5,904,498; 5,763,941 and 5,859,472, the disclosures of which are hereby incorporated by reference herein.

Figure 3:
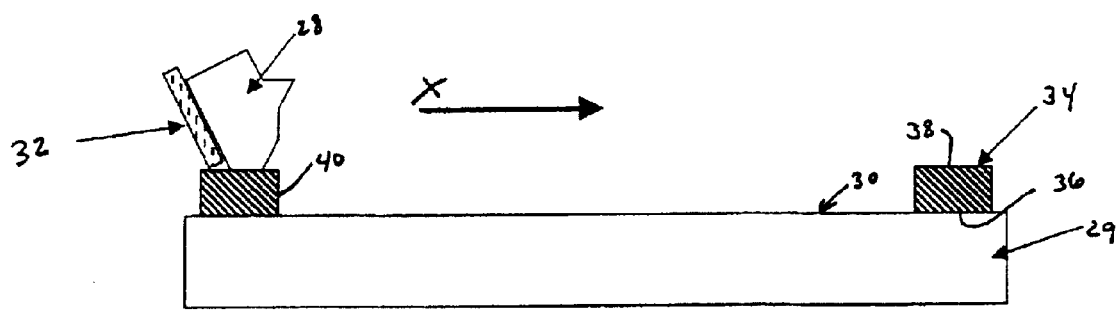
FIG. 3 is a schematic, cross-sectional view of a support at a further stage in the method of the embodiment of FIGS. 1–2A.

As shown in FIG. 3, a support 29 is provided. The support 29 has a surface 30 for forming and supporting a uniform layer 26 of flowable bonding material. A support 29 with a level or non-level surface may be used to form the uniform layer 26. The support 29 may comprise a table or a pan. The bonding material comprises any solder material for forming a bond between conductive features of microelectronic elements. In certain preferred embodiments, the bonding material comprises a solder paste 28.

The bonding material is applied to the surface 30 of the support 29 so as to form a uniform layer 26 of bonding material. Preferably, the layer 26 is formed on the surface 30 so that the layer 26 has a uniform top surface 33. The bonding material may be applied to the support 29 using a squeegee 32 loaded with the bonding material. The loaded squeegee 32 is drawn across the surface 30 of the support 29 to apply solder paste 28 to support 29. In certain embodiments, a stencil 34 having a first surface 36, a second surface 38 and an aperture 40 is placed on the surface 30 and the loaded squeegee 32 is drawn across the second surface 38 of the stencil 34, in the direction X shown in FIG. 3. As the squeegee 32 is drawn across the stencil 34, generally parallel to the surface 30, the solder paste 28 or other bonding material enters the aperture 40 or apertures and is applied to the surface 30 in a uniform layer. Alternatively, the layer 26 of solder paste 28 may be poured or otherwise dispensed onto surface 30. In certain embodiments, the stencil has an aperture 40 that is about the same size as the wafer 11, or at least large enough to cover the studs 20 on the wafer 11. In other embodiments, more than one aperture is used. The apertures must each substantially correspond to one or more studs 20 on the wafer 11.

For embodiments having gold studs, molten solder or solder paste may be utilized. The following solder materials may be used: high lead solders (preferably comprising about 90–99% lead and the balance comprising tin), C4, eutectic bonding materials, other materials comprising lead, tin, lead-free solders, and other solders.

Figure 4:
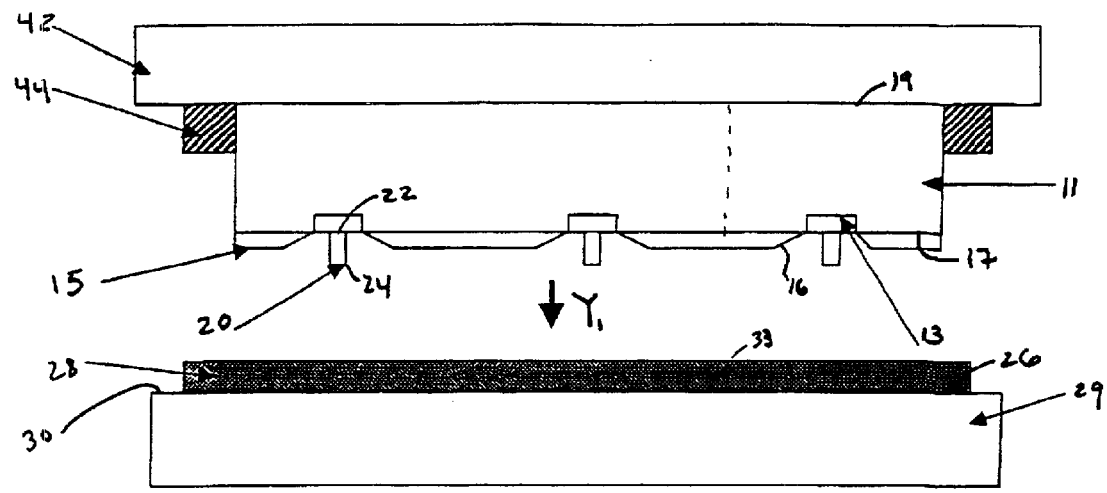
FIG. 4 is a schematic, cross-sectional view of the first microelectronic element and support at a later stage in the method of the embodiment of FIGS. 1–3.

As shown in FIG. 4, the wafer 11 is positioned with the studs 20 facing the surface 30. The wafer 11 is positioned so that the first surface 17 and the second ends 24 of the studs 20 face the layer 26 of solder paste 28. In preferred embodiments, the wafer 11 is arranged with respect to the surface 30 using a positioning apparatus, such as a pick and place machine, an apparatus having two platens, or any other device for positioning the wafer and support 29. The positioning apparatus 42 or other device has a clamp 44 such as a collet clamp which engages the wafer 11 and positions the wafer 11 so that the second ends 24 of the studs 20 are opposite the layer 26 of solder paste 28. The wafer 11 may be aligned with the layer 26 of solder paste 28 by a human observer, or by observing fiducial markers on the wafer 11 and/or the support 29, using an optical vision system or a human observer. Alignment of each stud 20 is not necessary, except to the extent that each stud is within the area covered by the layer 26 on support 29. The support 29 and positioning apparatus 42 may be moved in relation to one another manually or using a computer and robotics system incorporating the apparatus.

In certain preferred embodiments, the wafer 11 is heated through a heatable clamp 44. The clamp may be connected to a thermal electric heater or another type of heater, thermoelectric cooling devices or other cooling devices, and preferably is connected to appropriate feedback and control systems for controlling the temperature.

Heat is transferred from the wafer 11 to the studs 20. After the studs have been heated, the positioning apparatus 42 then moves the wafer 11 and the studs 20 toward the layer 26 of solder paste 28, in the direction $Y_1$, shown in FIG. 4, generally perpendicular to first surface 17 and surface 30 on the support 29. The positioning apparatus 42 dips the studs 20 in the solder paste 28. The positioning apparatus 42 is controlled by the computer or human operator so that the studs 20 do not collide with the surface 30 of the support 29, which could damage the studs 20 and possibly the microelectronic elements of the wafer 11. The movement of the wafer 11 is also controlled so as to apply a substantially uniform amount of solder paste 28 to each of the second ends 24 of the studs 20. The contacts 13 preferably comprise studs 20, or any other protrusions 21 having any other shape, so that the contacts 13 can be dipped in the layer 26. The passivation layer 15 on the wafer 11 comprises a material which is non-wettable by the solder so that the solder paste is not deposited on the wafer 11. After dipping, the wafer 11 and/or support 29 are moved away from one another.

Figure 5:
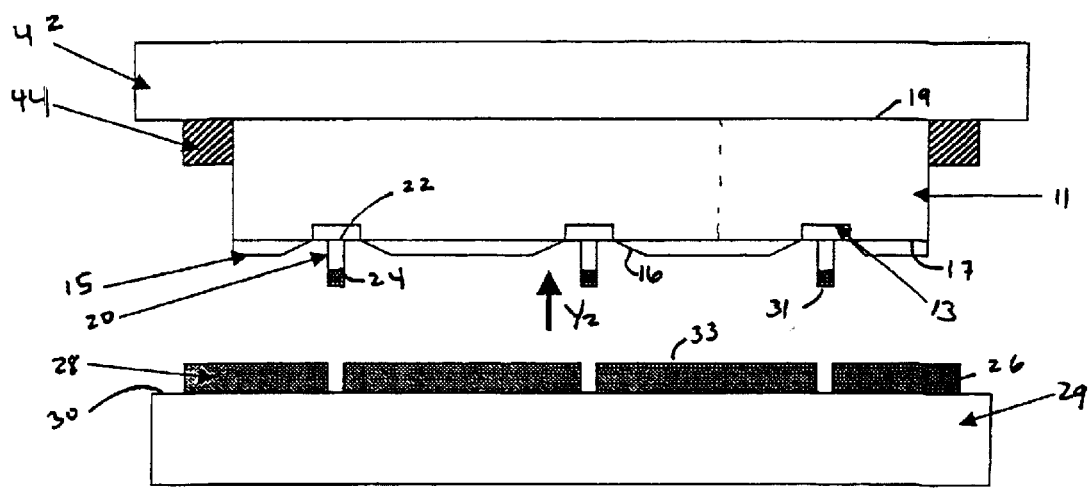
FIG. 5 is a schematic, cross-sectional view, of the first microelectronic element and support at a later stage in the method of the embodiment of FIGS. 1–4.

The wafer 11 is moved away from the support 29 in the direction $Y_2$ by the positioning apparatus 42, as shown in FIG. 5. Some of the solder paste 28 adheres to the second ends 24 of the studs 20 and remains on the studs 20 after the wafer 11 has been moved away from the support 29, transferring solder paste to the studs 20. The heated studs 20 heat the solder paste to the reflow temperature so that the solder paste reflows on the stud 20. Preferably, a uniform amount of reflowed solder 31 is provided on each of the studs 20.

In embodiments in which the dielectric layer 50 comprises a flexible sheet, the dielectric layer 50 is supported by a rigid frame or other support prior to assembly with the wafer 11. Certain embodiments of U.S. Pat. No. 5,518,964 and U.S. Patent Ser. No. 09/173,797, filed Oct. 16, 1998 and Ser. No. 09/174,074, filed Oct. 16, 1998, the disclosures of which are hereby incorporated by reference herein, include bonding a flexible layer to a rigid frame.

The wafer 11 and dielectric layer 50 are juxtaposed with one another, as by disposing the wafer 11 above the first face 54 of the dielectric layer 50 so that the studs 20 face toward the conductive features 52. The positioning apparatus 42 closely aligns the studs 20 with the tip ends 59 so that the reflowed solder 31 is contiguous with tip end 59. During positioning, the dielectric layer 50 may be held by a frame or clamp, or supported on a surface.

The studs 20 are electrically connected to the conductive features 52 by allowing the reflowed solder 31 on studs 20 to cool and solidify while the solder 31 is contiguous with the studs 20 and tip ends 59. The conductive features 52 and studs 20 are aligned by observing fiducial markers on the layer, by human observation or using an optical vision system, and positioning the wafer 11 with respect to the layer 50. Positioning of wafer 11 is typically accomplished using a robotic system or other positioning apparatus. To allow the reflowed solder 31 to cool, the heatable clamp 44 may be removed or switched to an unheated state. In certain preferred embodiments, the wafer 11 is cooled by applying a coolant or cold plate in contact with second surface 19 of the wafer 11. In certain preferred embodiments, a frame, such as, for example, the frame disclosed in U.S. Pat. No. 5,518,964, the disclosure of which is hereby incorporated by reference herein, is used to address any differential thermal expansion and/or contraction which may occur.

Figure 7:
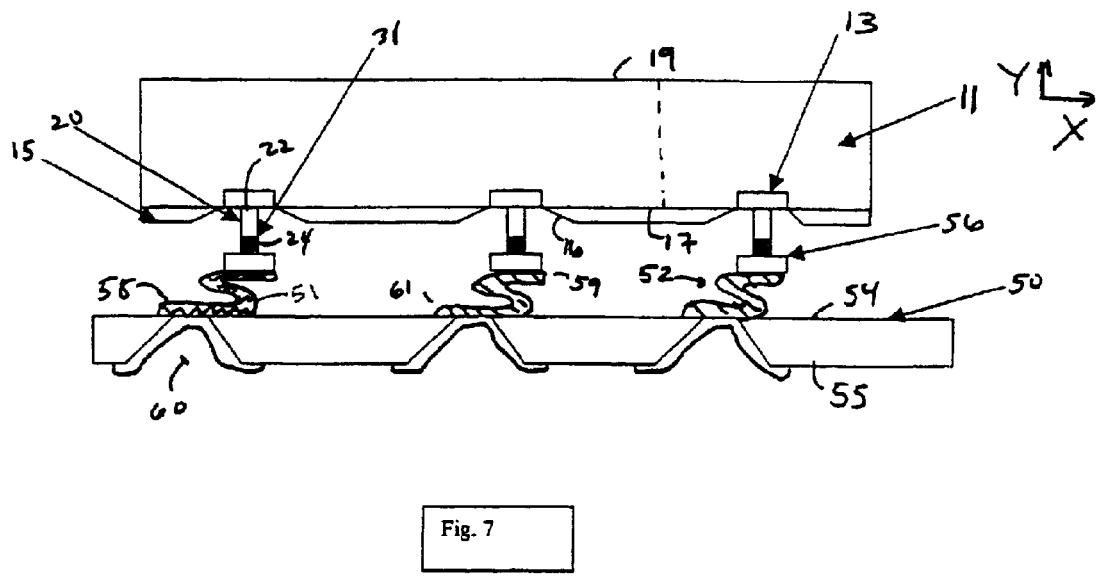
FIG. 7 is a schematic, cross-sectional view of the first microelectronic element and second microelectronic element at a later stage in the method of the embodiment of FIGS. 1–6.

In certain preferred embodiments, the tip ends 59 are displaced with respect to the terminal ends 61 so that the conductive features 52 are deformed into a desired shape, such as the shape shown in FIG. 7. The conductive features may be deformed as disclosed in certain embodiments of U.S. Pat. No. 5,518,964, the disclosure of which is hereby incorporated by reference herein. To deform the conductive features 52, the positioning apparatus 42 is moved in relation to the dielectric layer 50 so that the wafer 11 moves in the Y direction shown in FIG. 7, perpendicular to first face 54. The wafer 11 and layer 50 may be moved with respect to one another in the Y direction, may be moved in the X direction, parallel to the first face 54, or in both directions. In certain preferred embodiments, the wafer 11 is moved away from first face 54 and, at the same time, parallel to first face 54 to produce the features 52 shown in FIG. 7. The conductive features 52 shown in FIG. 7 are "S"-shaped. In deforming the conductive features 52 into the S-shaped features shown in FIG. 7, tip end 59 becomes detached from first face 54 of the layer 50. As shown in FIG. 7, the tip end 59 is moved relative to the terminal end 61 to deform conductive features 52 into the S-shaped features. Other movements of the first microelectronic element, the second microelectronic element, or both may be used to produce features having other shapes. The shape of the leads after displacing the tip ends of the leads is not essential to the invention.

Thus, the movements of the wafer in any of the steps described above are not essential. For example, in dipping the contacts, the first microelectronic element may be moved. Alternatively or additionally, the support 29 may be engaged by a clamp of a similar positioning apparatus and moved in relation to the wafer 11. In other preferred embodiments, the wafer 11, support 29 and layer 50 may be moved and aligned with respect to one another. Vacuum platens, as disclosed in U.S. Pat. No. 5,518,964, the disclosure of which is hereby incorporated by reference herein, may be used. In other preferred embodiments, the wafer 11 and layer 50 may be moved in relation to one another by injecting a flowable dielectric material between the wafer and the layer under sufficient pressure to move the wafer 11 which respect to the layer 50, thereby deforming the conductive features 52. Such a technique is disclosed in certain embodiments of commonly assigned U.S. Pat. No. 5,518,964, the disclosure of which is hereby incorporated by reference herein.

After deforming the conductive features 52, a flowable encapsulant is introduced between the wafer 11 and layer. The encapsulant preferably comprises a curable dielectric material, which is preferably injected into the space between the first face 54 of the layer 50 and the first surface 17 of the wafer 11. The flowable material is injected so that any conductive features on the second face 55 of the dielectric layer 50 are not covered by the flowable material. Preferably, the encapsulant penetrates between all of the leads. The encapsulant, in certain preferred embodiments, is selected so that it will cure to a compliant material. Preferred compliant materials include elastomers. The encapsulant may be injected under external pressure or may be allowed to fill the space between the first face 54 and the first surface 17 by capillary action. After injecting the encapsulant, the curable material may be cured. The encapsulant may be cured in place either at room temperature or upon exposure to heat or radiant energy depending upon the particular material selected.

The assembled first microelectronic element and second microelectronic element form a microelectronic package. Preferably, the package forms part of a compliant interconnect structure. In certain compliant interconnect structures, the encapsulant comprises a compliant material or a material curable to a compliant material. In certain compliant interconnect structures, the conductive features of the second microelectronic element that extend between the first microelectronic element and the second microelectronic element are flexible so that the contacts of the first microelectronic element are moveable with respect to the second microelectronic element. The encapsulant and/or conductive features may comprise materials and/or structures disclosed in certain embodiments of U.S. Pat. Nos. 5,148,266 and 5,148,265, the disclosures of which are hereby incorporated by reference herein.

Only a small volume of solder on the studs is required to form an acceptable connection between the first microelectronic element and the second microelectronic element. In embodiments in which the contacts are comprised of gold, the effects of solder embrittlement are minimized by incorporating compliant and flexible materials in the interconnect structure. Such structures result in low stresses on the connection between the contacts of the first microelectronic element and the conductive features of the second microelectronic element. In certain preferred embodiments, the solder composition is selected so that the solder is insensitive to gold embrittlement, such as solder compositions which are doped with indium.

Solder balls or other structures may be formed on the terminal structures 60 to complete the assembly. The solder balls may be used to form connections with external circuitry, as is known in the art. Such external circuitry may include printed circuit boards and other substrates having conductive elements. The semiconductor chips of the wafer 11 may be individualized by a dicing operation, in which the material of the wafer 11 and layer 50 is cut around the semiconductor chips so as to remove the chips from being connected with one another and the material of the wafer 11. By dicing, individual microelectronic packages incorporating a chip and a chip area of the layer are separated from one another.

In another embodiment of the invention, the protrusions are not heated prior to dipping in the solder paste. The studs are dipped and removed from the layer of solder paste so that solder paste is transferred to the studs. After the step of dipping, solder paste adheres to the studs. The wafer is juxtaposed with a dielectric layer or other microelectronic element so that the solder paste is in contact with conductive features of the other microelectronic element. Utilizing the heatable clamp, the wafer is heated, heating studs, to the reflow temperature of the solder paste while the solder paste is in contact with the conductive features. After the solder cools, the studs are bonded to the conductive features. Other methods of applying heat to the solder paste may be used, such as a reflow oven or any other method. In addition, the application of other forms of energy may be used to reflow the solder paste, or to melt or set other bonding materials in bonding the conductive features and conductive elements. In certain preferred embodiments, the conductive features may be deformed as discussed above and the assembly may be encapsulated.

In other preferred embodiments, the solder paste includes flux material having a tackiness sufficient to hold the contacts in place on the conductive features 52 shown in FIG. 6, until reflow of the solder paste 28 is performed. This may be desirable where the first and second microelectronic elements are transferred to a different apparatus, after being juxtaposed, for reflow. The solder paste may temporarily hold the microelectronic elements together until reflowed in a reflow oven.

The use of the studs with solder connections tends to lengthen the solder connection and tends to result in a better stress distribution for the connection. The studs may be dipped to as to coat the entire stud with solder, forming a column of solder on the stud. After the solder is reflowed and then allowed to solidify, a solder connection reinforced by the bump is formed.

As used herein, the term "first microelectronic element" comprises semiconductor chips, wafers having a plurality of semiconductor chips, and multi-chip modules and the term "second microelectronic element" comprises connection components, substrates, carriers, supports, or sacrificial layers. However, the present invention also contemplates embodiments in which both elements comprise wafers or both elements comprise semiconductor chips. The second microelectronic element may be comprised of several dielectric layers. For example, the second microelectronic element may comprise a component as disclosed in certain embodiments of U.S. patent application Ser. No. 09/271,688, filed Mar. 18, 1999, the disclosure of which is hereby incorporated by reference herein.

Figure 8:
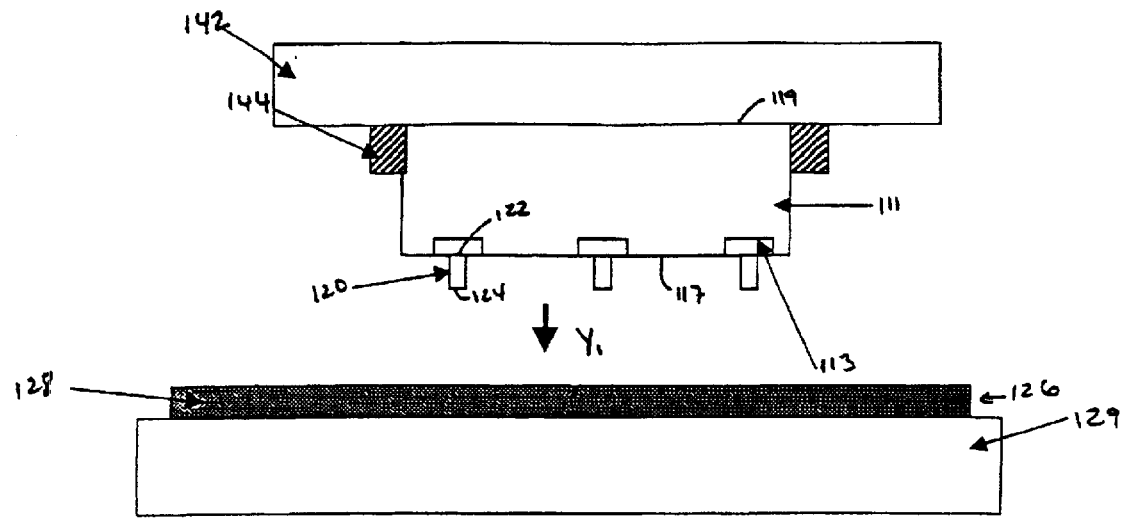
FIG. 8 is a schematic, cross-sectional view of a first microelectronic element and second microelectronic element in another embodiment of the invention.
Figure 9:
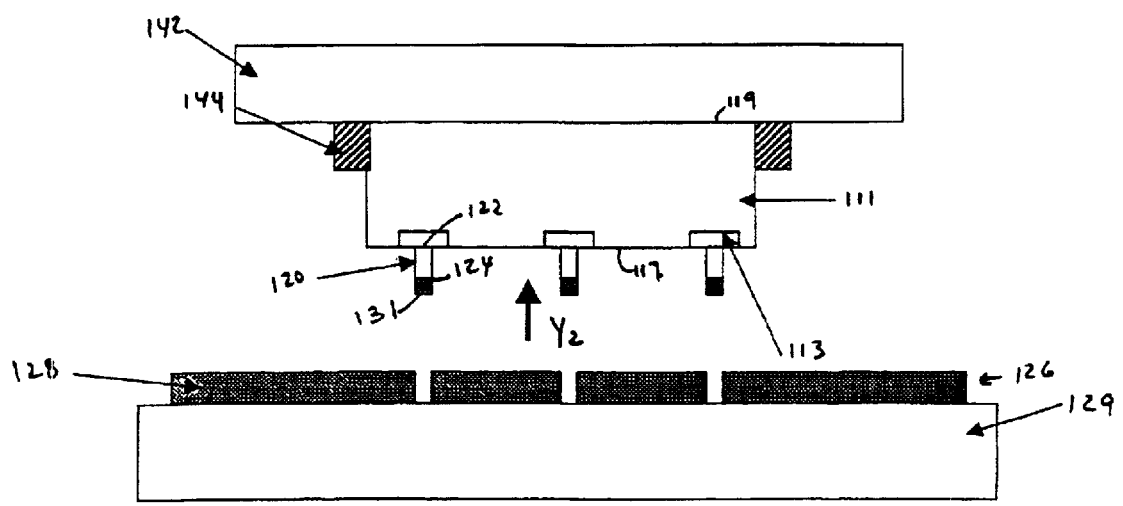
FIG. 9 is a schematic, cross-sectional view of FIG. 8 at a later stage in the method.
Figure 10:
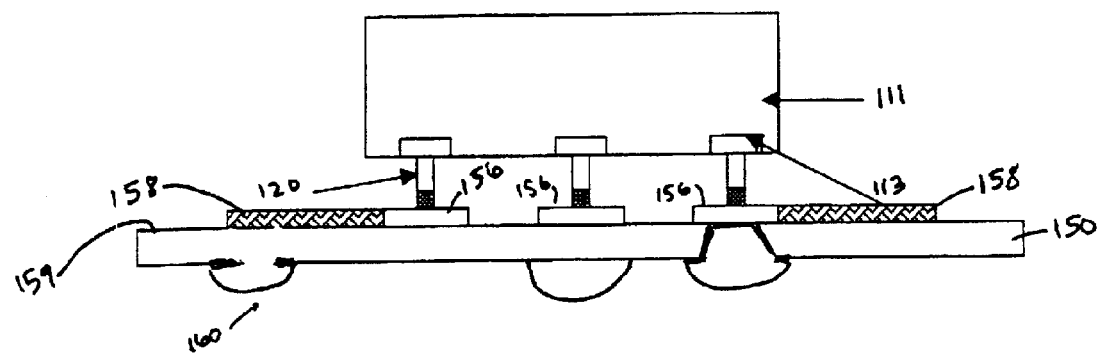
FIG. 10 is a schematic, cross-sectional view of a first microelectronic element and second microelectronic element at a later stage in the method of the embodiment of FIGS. 8–9.

In certain embodiments, the first microelectronic element comprises an individual semiconductor chip having contacts. The chip is assembled with a dielectric layer having conductive features, which may comprise a structure including terminal structures. One such embodiment is shown in FIGS. 8–10. Similar features in these figures and in FIGS. 11–14 have similar reference numerals. The steps in this embodiment may be performed as discussed above. Semiconductor chip 111 has a first surface 117 and a second surface 119 facing oppositely from the first surface 117. Contacts 113 are exposed at first surface 117. In certain preferred embodiments, contacts 113 comprise studs 120. As shown in FIGS. 8–10, the semiconductor chip 111 is engaged by a positioning apparatus 142. A beatable collet clamp 144 of a positioning apparatus 142 may be used to heat the semiconductor chip 111, thereby heating the studs 120 of the semiconductor chip. The positioning apparatus 142 dips the second end 124 of the studs in a uniform layer 126 of solder paste 128 provided on a support 129. The positioning apparatus 142 juxtaposes the semiconductor chip 111 with a dielectric layer 150 or other microelectronic element. The dielectric layer 150 includes contacts 156 and traces 158 extending on a surface 159 thereof. The positioning apparatus 142 closely aligns the second ends 124 of the studs 120 with pads 156 of the dielectric layer 150. The collet clamp may be used to reflow the solder paste 128 before or after the step of aligning the studs with pads of the layer. The reflowed solder 131 is allowed to cool to form an electrical connection between the studs 120 and the pads 156 by removing the collet clamp 144, or other methods discussed above. The assembly is preferably encapsulated and, in certain preferred embodiments, a compliant layer between the chip and the layer is formed, as discussed above.

Other methods of applying heat to the bonding material may be used. For example, methods disclosed in certain embodiments of U.S. patent application Ser. Nos. 09/523,513, 09/523,512, and 09/523,514, all filed Mar. 10, 2000 by Beroz, et al., the disclosures of which are hereby incorporated by reference herein may be used. In other embodiments, the second surface of the microelectronic element may be heated by exposure to a hot heat transfer fluid such as a liquid or a hot gas to apply heat to the bonding material.

Figure 13:
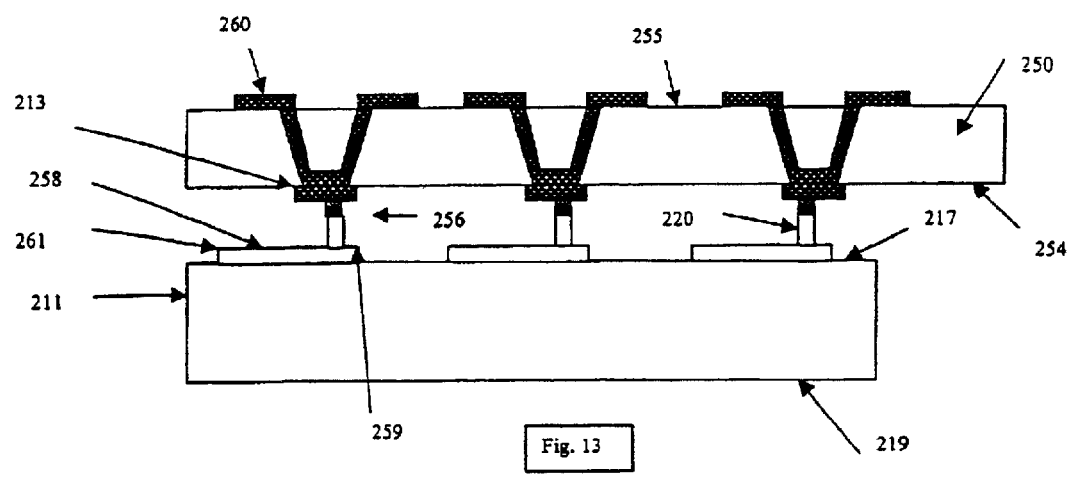
FIG. 13 is a schematic, cross-sectional view of the microelectronic element and second microelectronic element at a later stage in the method of the embodiment of FIGS. 11 and 12.

In other embodiments, a first microelectronic element comprising a wafer may incorporate conductive elements attached to the contacts. As shown in FIGS. 11–14, the first microelectronic element comprises a wafer 211 having a first surface 217 and a second surface 219 facing in a direction opposite from the first surface 217. The wafer has leads 258 extending on the first surface 217. Each lead 258 has a first end 261 attached to the wafer of the first surface 254 and a second end 259 offset from the first end 261. First end 261 is connected to the internal circuitry of a chip incorporated within the wafer 211. Although FIG. 13 shows only three leads 258 attached to the wafer 211, a number of such leads would be attached to the wafer for each of the semiconductor chips incorporated within the wafer. The figures are not drawn to scale and only a few features are shown for ease of illustration.

Figure 11:
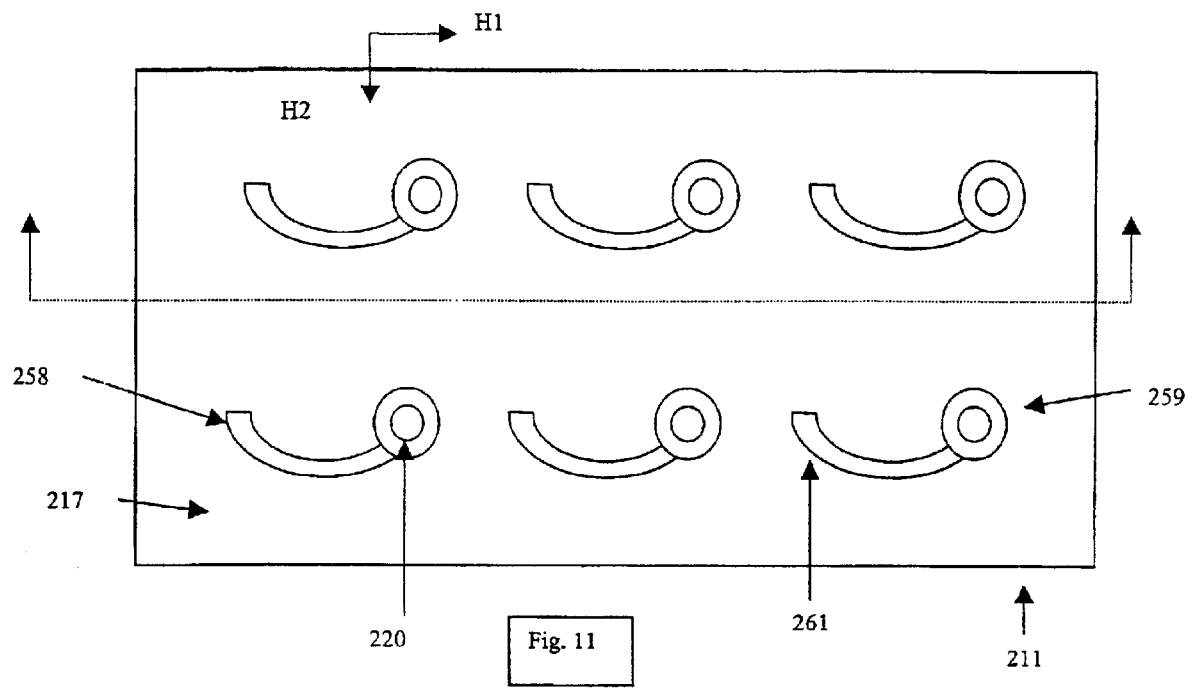
FIG. 11 is a schematic, top plan view of a first microelectronic element in a method in accordance with a further embodiment of the invention.
Figure 12:
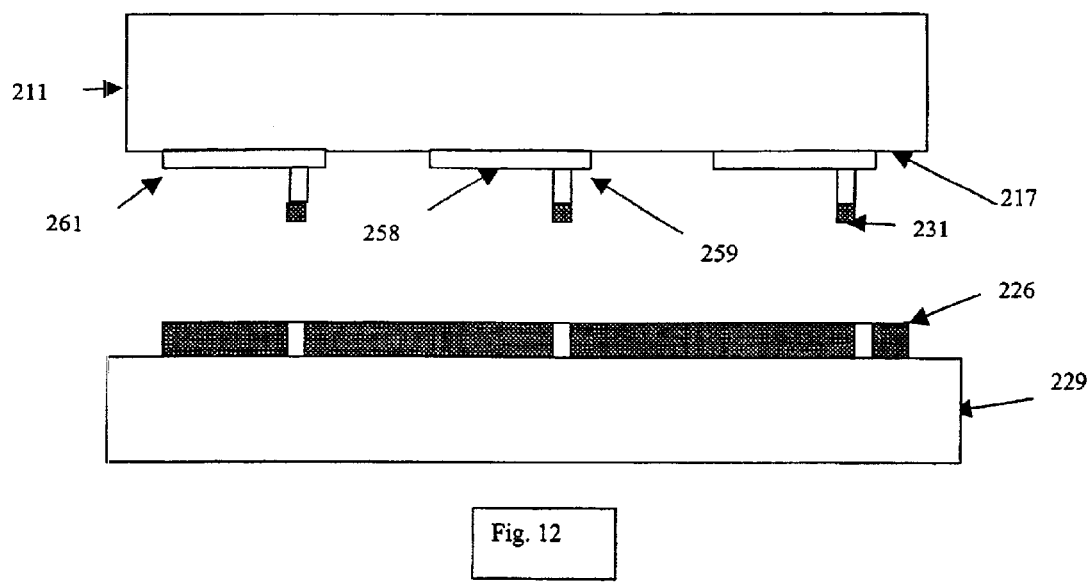
FIG. 12 is a schematic, cross-sectional view of a first microelectronic element and support at a later stage in the method of the embodiment of FIG. 11.

Contacts 213 at the second end 259 of the lead 258 are provided for forming interconnections with another microelectronic element, such as the layer 250 shown in FIG. 13. Contacts 213 preferably include features having a shape which protrude from the first surface 217 so that the contacts can be dipped in a bonding material for electrically interconnecting microelectronic elements 211 and 250. In certain preferred embodiments, contacts 213 include studs 220 and may be formed as discussed above or using any other method. The studs 220 are attached to the pads at the second ends 259 as shown in FIG. 11. In certain preferred embodiments, the lead 258 has a curved shape so that the lead 258 extending on first surface 217 generally extends in a direction H1, which is parallel with the surface 217 and is curved in a direction H2, which is also parallel with surface 217 but in a direction perpendicular to the direction H1.

Figure 14:
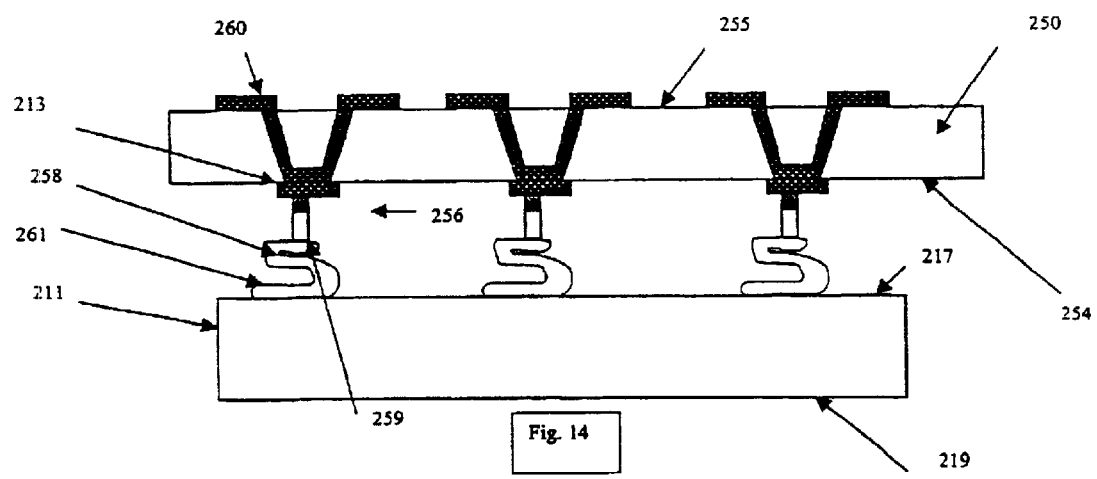
FIG. 14 is a schematic, cross-sectional view of the first microelectronic element and second microelectronic element at a later stage in the method of the embodiment of FIGS. 11–13.

As shown in FIG. 13, the dielectric layer 250 has a first surface 254 and a second surface 255 facing in a direction opposite from surface 254. First surface 254 includes conductive features for forming electrical connections with the contacts 213 of the wafer 211. In certain preferred embodiments, the conductive features of the dielectric layer 250 comprise pads 252 exposed at the first surface 254. The dielectric layer 250 may also comprise vias lined with an electrically conductive material and having conductive features exposed at the second surface 255 for forming connections with printed circuit boards, other substrates, or any other microelectronic elements, as shown in FIG. 14.

The studs 220 are dipped (FIG. 12) in a uniform layer 226 of conductive material, such as solder paste, and may be dipped prior to heating the studs 220, during heating, or after heating the studs, as discussed above. The wafer 211 is then assembled with the other microelectronic element, such as the dielectric layer 250 depicted in FIG. 13. After the microelectronic elements are juxtaposed with one another and solder paste 231 is allowed to cool, the studs 220 of the wafer 211 are bonded with the conductive features of the layer 250.

The assembly of the first and second microelectronic elements is preferably encapsulated. The wafer and the layer may also be severed in a dicing operation to individualize the semiconductor chips incorporated within the wafer.

Although the invention herein has been described with reference to particular embodiments, it is to be understood that these embodiments are merely illustrative of principals and applications of the present invention. For example, the first microelectronic element may include contacts having shapes other than the studs shown in FIGS. 1–14 and these contacts may be dipped to transfer solder paste to the contacts. In addition, the contacts of the first microelectronic element may be dipped into bonding materials other than solder paste. For example, the contacts may be dipped into flowable conductive polymers or melted metals. The conductive features of the second microelectronic element need not be deformed in certain preferred embodiments, and in other preferred embodiments, the conductive features are deformed into shapes other than those shown in FIG. 7 above. The first microelectronic element and the second microelectronic element may comprise other microelectronic elements in addition to the wafer, semiconductor chip and dielectric layer discussed above. It is therefore to be understood that numerous modifications may be made to the illustrative embodiments and that other arrangements may be devised without departing from the spirit and scope of the present invention.

What is claimed is:

1. A method of electrically interconnecting microelectronic elements, comprising:

providing a first microelectronic element having a first surface and contacts exposed at the first surface, the contacts including electrically conductive pads and elongated electrically conductive protrusions extending away from said pads and extending away from the first surface, providing a substantially uniform layer of bonding material on a support, dipping the protrusions of the contacts into the substantially uniform layer of bonding material so as to transfer at least some of the bonding material onto the protrusions, and bonding the contacts to conductive features of a second microelectronic element using said bonding material on said protrusions.

2. The method of claim 1, wherein the step of dipping comprises dipping the protrusions in a substantially uniform layer of bonding material so that a substantially uniform amount of bonding material is transferred onto each protrusion.

3. The method of claim 1, wherein the step of bonding includes applying heat to the bonding material.

4. The method of claim 3, wherein the bonding material comprises solder paste and the step of heating comprises heating the solder paste to reflow the solder paste.

5. The method of claim 1, wherein the step of bonding comprises juxtaposing the first microelectronic and the second microelectronic element with one another so that the bonding material on the protrusions is contiguous with the conductive features.

6. The method of claim 5, wherein the bonding material is heated before the step of juxtaposing the first microelectronic element and second microelectronic element with one another.

7. The method of claim 5, wherein the bonding material is heated while the first microelectronic element and second microelectronic element are juxtaposed with one another.

8. The method of claim 1, further comprising heating the contacts before the step of dipping.

9. The method of claim 1, further comprising heating the contacts after the step of dipping.

10. The method of claim 1, wherein the protrusions of the contacts comprise studs attached to the pads.

11. The method of claim 10, wherein the studs comprise gold studs.

12. The method of claim 10, wherein the studs have a first end connected to the pads and a second end facing away from the pads for receiving bonding material.

13. The method of claim 12, wherein the step of dipping the studs includes applying bonding material to the second ends of the studs by dipping the second end of the studs in the bonding material.

14. The method of claim 10, further comprising forming said studs on said pads utilizing wire bonding.

15. The method of claim 1, wherein the first microelectronic element comprises a unitary semiconductor wafer having a plurality of regions constituting a plurality of semiconductor chips, each of the semiconductor chips having contacts to be bonded to one of the conductive features of the second microelectronic element.

16. The method of claim 15, wherein the wafer includes a plurality of elongated leads extending along the first surface, each lead being connected to a contact.

17. The method of claim 16, wherein the leads have first ends connected to the wafer and second ends carrying the contacts.

18. The method of claim 17, further comprising, after the step of bonding, displacing the second ends of the leads relative to the first ends so as to bend the second ends away from the wafer and so that the leads extend away from the first surface.

19. The method of claim 18, further comprising the step of injecting a flowable dielectric material around the leads and curing the flowable dielectric material to form a dielectric support layer around the leads.

20. The method of claim 19, wherein the second microelectronic element comprises a flexible dielectric layer.

21. The method of claim 20, wherein the step of displacing comprises moving the wafer and flexible dielectric layer with respect to one another.

22. The method of claim 19, further comprising the step of severing the wafer and the dielectric support layer to form a plurality of units, each unit including a semiconductor chip and a portion of the dielectric support layer.

23. The method of claim 1, wherein the conductive features comprise elongated leads extending along a first face of the second microelectronic element, and wherein at least some of the leads are bonded to a contact during the bonding step.

24. The method of claim 23, wherein the leads have first ends attached to the second microelectronic element and second ends, wherein at least some of the second ends are attached to the contacts during the bonding step.

25. The method of claim 24, further comprising displacing the second ends of the leads relative to the first ends so as to bend the second ends away from the second microelectronic element and so that the leads extend away from the first face.

26. The method of claim 25, further comprising injecting a flowable dielectric material around the leads after the step of displacing the second ends and curing the flowable dielectric material to form a dielectric support layer around the leads.

27. The method of claim 26, wherein the step of displacing comprises moving the second microelectronic element with respect to the first microelectronic element.

28. The method of claim 1, wherein the first microelectronic element comprises a dielectric layer.

29. The method of claim 28, wherein the second microelectronic element comprises a wafer of a plurality of semiconductor chips, the wafer having said conductive features exposed at a first face of the wafer.

30. The method of claim 29, wherein the wafer has leads with first ends attached to the wafer and second ends for being bonded to the protrusions.

31. The method of claim 1, further comprising assembling the second microelectronic element with a substrate and connecting the conductive features of the second microelectronic element with conductive elements of the substrate.

32. The method of claim 1, wherein the protrusions comprise gold and the bonding material includes indium.

33. The method of claim 1 wherein said dipping step is performed so as to apply said bonding material to said protrusions without applying said bonding material to said pads.

34. The method of claim 1 wherein said bonding material includes a solder, said pads are not wettable by said solder and said protrusions are wettable by said solder.

35. The method of claim 1 wherein said first microelectronic element includes a dielectric layer on said first surface, said dielectric layer having apertures, said protrusions extending from said pads through said apertures beyond said dielectric layer.

36. A method of electrically interconnecting microelectronic elements, comprising:

providing a first microelectronic element having a first surface and contacts exposed at the first surface, the contacts including protrusions extending away from the first surface, providing a substantially uniform layer of bonding material on a support, dipping the protrusions of the contacts into the substantially uniform layer of bonding material so as to transfer at least some of the bonding material onto the contacts, and bonding the contacts to conductive features of a second microelectronic element, wherein the step of bonding includes applying heat to the bonding material, wherein the bonding material comprises solder paste and the step of applying heat comprises heating the solder paste to reflow the solder paste, and wherein the contacts of the first microelectronic element are heated before the step of dipping so as to heat the solder paste transferred to the contacts.

37. The method of claim 36, wherein the step of bonding comprises heating the protrusions to reflow the solder paste while the protrusions and conductive features are contiguous with the solder paste.

* * * * *